United States Patent
Fan

(10) Patent No.: US 9,853,015 B1
(45) Date of Patent: Dec. 26, 2017

(54) SEMICONDUCTOR DEVICE WITH STACKING CHIPS

(71) Applicant: POWERTECH TECHNOLOGY INC., Hsinchu County (TW)

(72) Inventor: Wen-Jeng Fan, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/381,069

(22) Filed: Dec. 15, 2016

(51) Int. Cl.
*H01L 25/065* (2006.01)
*H01L 25/00* (2006.01)
*H01L 23/00* (2006.01)

(52) U.S. Cl.
CPC ......... *H01L 25/0657* (2013.01); *H01L 25/50* (2013.01); *H01L 24/48* (2013.01); *H01L 2224/48091* (2013.01); *H01L 2224/48106* (2013.01); *H01L 2224/48227* (2013.01); *H01L 2225/0651* (2013.01); *H01L 2225/06562* (2013.01); *H01L 2225/06586* (2013.01); *H01L 2225/06593* (2013.01)

(58) Field of Classification Search
CPC ...... H01L 25/0657; H01L 25/50; H01L 24/48
See application file for complete search history.

(56) References Cited

U.S. PATENT DOCUMENTS

| | | | | |
|---|---|---|---|---|
| 5,721,452 A * | 2/1998 | Fogal | ...................... | H01L 24/49 257/685 |
| 6,359,340 B1 * | 3/2002 | Lin | ..................... | H01L 25/0657 257/723 |
| 7,368,811 B2 * | 5/2008 | Kang | ...................... | H01L 24/32 257/686 |
| 7,777,348 B2 * | 8/2010 | Kodama | ................. | H01L 24/06 257/686 |
| 9,293,443 B2 * | 3/2016 | Nam | ................... | H01L 25/0657 |
| 2008/0182432 A1 * | 7/2008 | Huang | ................ | H01L 21/4846 439/66 |
| 2011/0304044 A1 * | 12/2011 | Lin | ......................... | H01L 24/16 257/738 |
| 2014/0239514 A1 * | 8/2014 | Haba | ...................... | H01L 24/49 257/778 |

* cited by examiner

*Primary Examiner* — William Coleman
(74) *Attorney, Agent, or Firm* — Winston Hsu

(57) ABSTRACT

A semiconductor device includes a first chip, a spacer, and a second chip. The first chip and the spacer are disposed on a substrate. The second chip has a first half end portion disposed on a first half end portion of the first chip, and a second half end portion disposed on the spacer. The height of the spacer is substantially equal to the height of the first chip.

11 Claims, 9 Drawing Sheets

SEMICONDUCTOR DEVICE WITH STACKING CHIPS

BACKGROUND OF THE INVENTION

1. Field of the Invention

This invention relates to a semiconductor device, and more particularly, a semiconductor device with a stacking structure.

2. Description of the Prior Art

Since the market demands for electronic devices with more functions and greater storage capacity, semiconductor electronic devices are striving to include more chips in one package to save space and increase density and multi-functionalities. Even so, the urge for further area reduction is still strong. Therefore, disposing chips with a stacking structure has become an option for area reduction. For example, to achieve an increased memory density within a single package, multiple semiconductor chips or dies may be stacked in a single package. The increased number of dies provides a corresponding increase in storage capacity relative to a single die.

FIG. 1 shows a semiconductor device 100 of prior art. The semiconductor device 100 includes four stacking memory chips 110. The four stacking memory chips 110 are stacked in a crisscrossing manner. Each memory chip 110 has bonding pads 110A that are electrically connected via bonding wires 120 to a common substrate 130. The substrate 130 provides further electrical connections from the bonding wires 120 to solder balls 140 on the opposite side of the substrate 130, forming a ball grid array (BGA) for connection to an external device.

Since the bonding pads 110A of the memory chips 110 are usually located along the sides of the memory chips 110, the press force applied on the bonding pads 110A of the memory chips 110 on their upper surfaces during the bonding process may damage the stacking structure. Therefore, the semiconductor device 100 further includes six spacers 150 to support the structure of the four stacking chips 110 and prevent the four stacking chips 110 from being damaged during the wire bonding process. However, the formation of the spacers 120 involves a complicate process, and have disadvantages of lowering yield and higher cost.

SUMMARY OF THE INVENTION

One embodiment of the present invention discloses a semiconductor device. The semiconductor device includes a substrate, a plurality of chips, a plurality of spacers and a plurality of soldering bumps.

The chips are stacked on a first surface of the substrate. Odd chips of the plurality of chips are staggered from each other, and even chips of the plurality of chips are staggered from each other. The spacers are for supporting the plurality of chips. The soldering bumps are planted on a second surface of the substrate.

The odd chips and the even chips are stacked in an interleaving manner from each other and an orientation of each odd chip is perpendicular to an orientation of each even chip. A first chip of the plurality of chip is disposed on the substrate, and each of the plurality of chips above the first chip is supported by at least one spacer.

Another embodiment of the present invention discloses a semiconductor device. The semiconductor device includes a substrate, a first chip, a plurality of chips, a plurality of spacers, and a plurality of soldering bumps.

The first chip is disposed on a first surface of the substrate. The chips are stacked on the first chip. The spacers are for supporting the plurality of chips. The soldering bumps are planted on a second surface of the substrate.

Each of the plurality of chips has a first half end portion disposed on a half end portion of a corresponding chip and a second half end portion disposed on a corresponding spacer.

Another embodiment discloses a method for producing a semiconductor device. The method includes disposing a first chip on a substrate, disposing a spacer on the substrate, and disposing a second chip on the first chip and the spacer. The first chip has a first half end portion and a second half end portion. The second chip has a first half end portion disposed on the first half end portion of the first chip, and a second half end portion disposed on the spacer. The height of the spacer is substantially equal to the height of the first chip.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
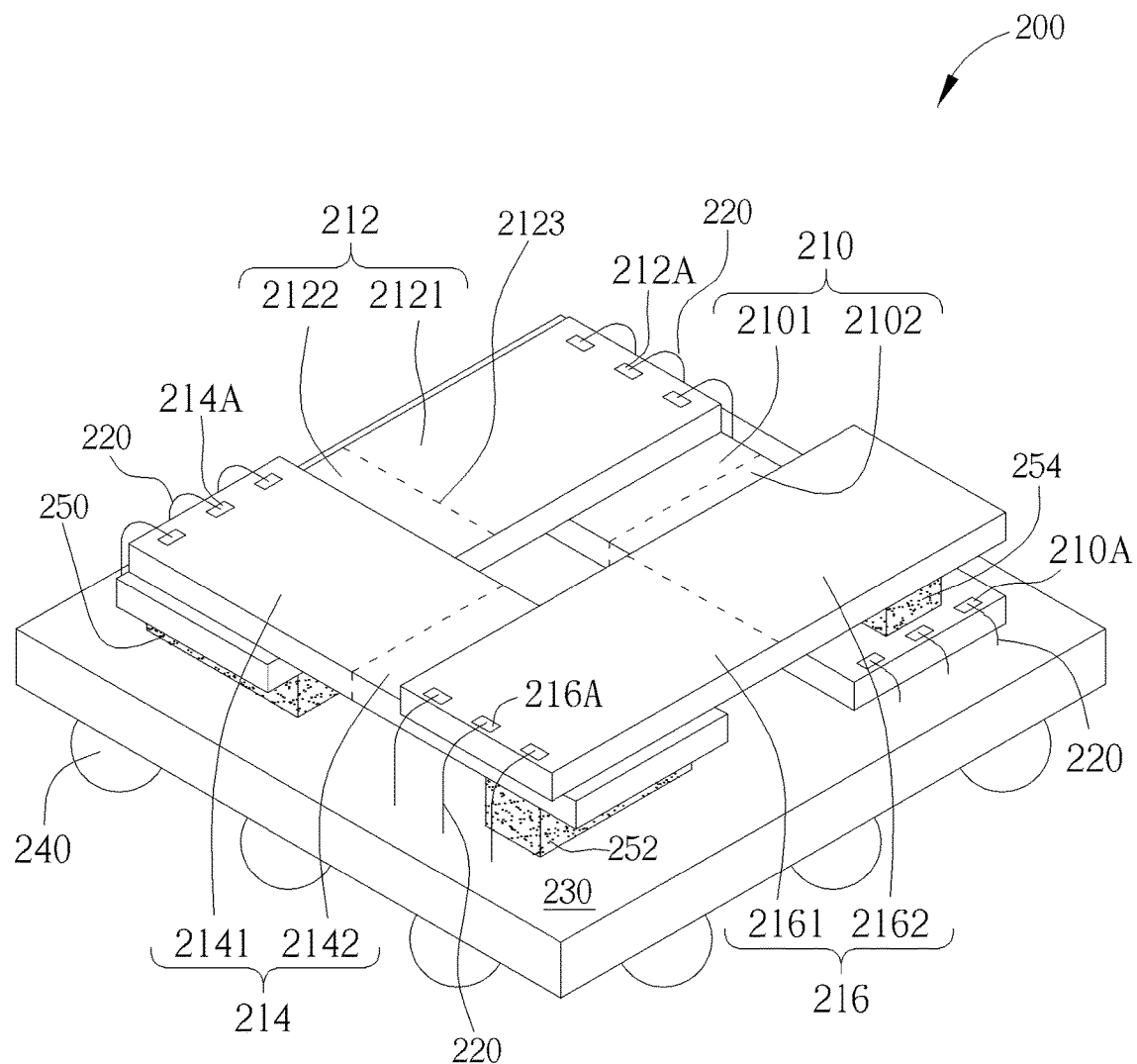
FIG. 2 shows a semiconductor device according to one embodiment of the present invention.

FIG. 2 shows a semiconductor device 200 according to one embodiment of the present invention. The semiconductor device 200 includes a first chip 210, a second chip 212, a third chip 214, a fourth chip 216, a first spacer 250, a second spacer 252, and a third spacer 254. In some embodiments, the four chips 210 to 216 may be memory chips of the same type having the same size and the same shape, such as rectangular. However, this is not to limit the scope of the embodiment.

The first chip 210 is disposed on a first surface of the substrate 230. The substrate 230 may have soldering balls 240 formed on a second surface that is opposite to the first surface for external connection. The first chip 210 includes bonding pads 210A that are electrically connected to the substrate 230 via bonding wires 220. The second chip 212 includes bonding pads 212A that are electrically connected to the substrate 230 via bonding wires 220. The third chip 214 includes bonding pads 214A that are electrically connected to the substrate 230 via bonding wires 220. The fourth chip 216 includes bonding pads 216A that are electrically connected to the substrate 230 via bonding wires 220.

In FIG. 2, considering the stacking order, the first chip 210 and the third chip 214 may be considered as odd chips and the second chip 212 and the fourth chip 216 may be considered as even chips. In this case, the odd chips 210 and 214 and the even chips 212 and 216 are stacked in an interleaving manner from each other. Also, an orientation of each odd chip is perpendicular to an orientation of each even chip. For example, a long side of the first chip 210 is perpendicular to a long side of the second chip 212, and the long side of the second chip 212 is perpendicular to a long side of the third chip 214. Furthermore, odd chips 210 and 214 are staggered stacked from each other, and even chips 212 and 216 are staggered stacked from each other.

The first spacer 250 is disposed on the first surface of the substrate 230, and the second chip 212 is stacked on the first spacer 250 and the first chip 210. To ensure the second chip 212 is disposed on the first spacer 250 and the first chip 210 steadily, the height of the first spacer 250 may be substantially equal to the height of the first chip 210 after disposing.

The second spacer 252 may be disposed on the first surface of the substrate 230, and the third chip 214 is stacked on the second spacer 252 and the second chip 212. Also, the second spacer 252 has a height substantially equal to a total height of the first chip 210 and the second chip 212 after disposing. The third spacer 254 is disposed on the first chip 210 and has a height from the substrate 230 substantially equal to a total height of the second chip 212 and the third chip 214. The fourth chip 216 is stacked on the third spacer 254 and the third chip 214.

In this embodiment, the thickness of the first spacer 250 may be substantially equal to the thickness of the third spacer 254. And, the thickness of the second spacer 252 may be substantially twice the thickness of the first spacer 250.

In this case, since the odd chips 210 and 214 are staggered from each other and the even chips 212 and 216 are staggered from each other, the bonding pad may be arranged to be evenly distributed on the substrate 230. Therefore, the complicate routing is reduced during the bonding process, thereby simplifying the bonding process and improving the yield rate.

Figure 1:
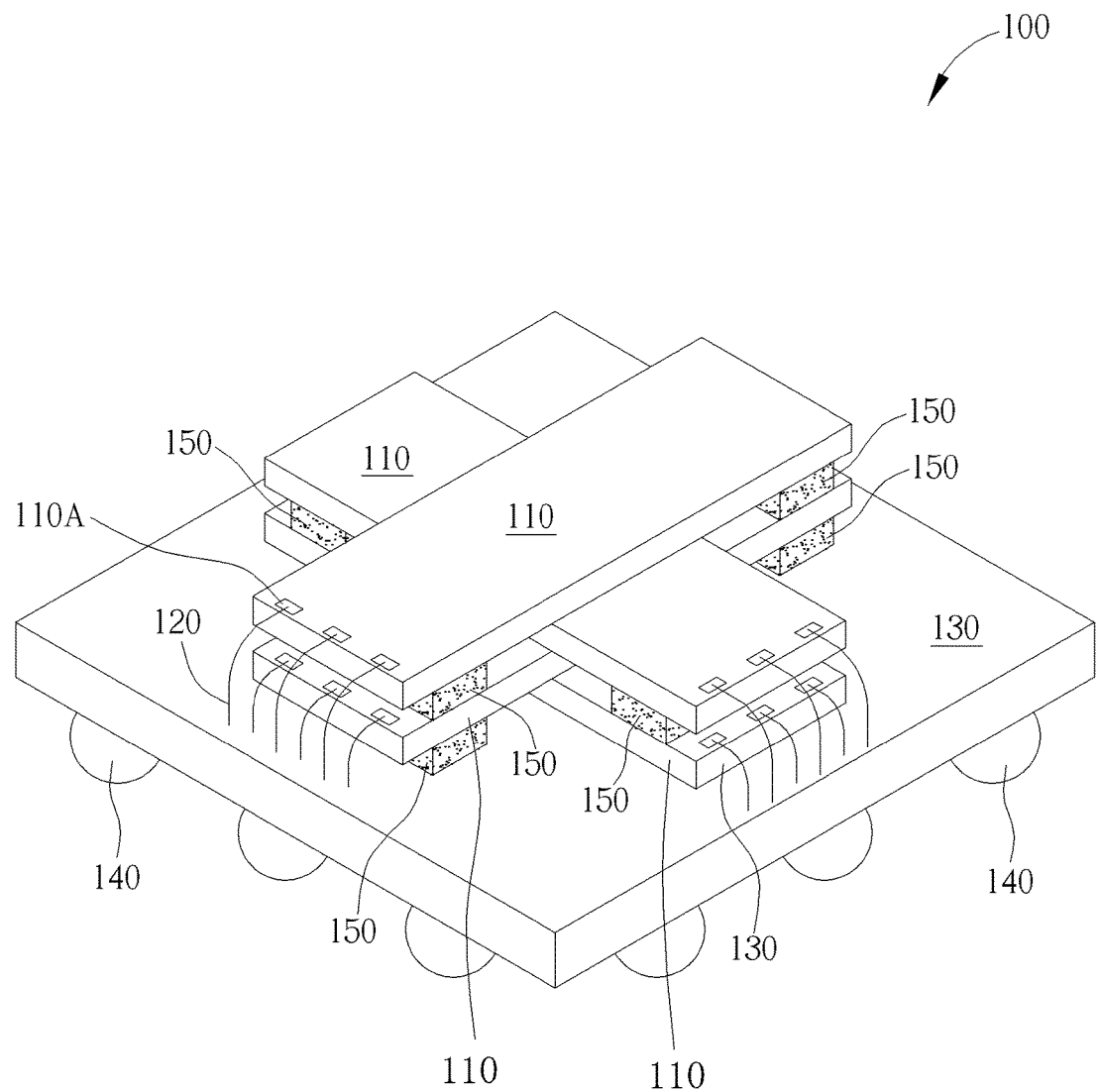
FIG. 1 shows a semiconductor device of prior art.

Furthermore, since the chips 210 to 216 are stacked in an interleaving and staggered manner, the semiconductor device 200 requires at least three spacers 250 to 254 to support the chips 212 to 216. Therefore, comparing to the six spacers required by the prior art as shown in FIG. 1, the manufacturing process of the semiconductor device 200 is further simplified, improving the yield of the manufacturing process.

To ensure that the structure is steady, each of the chips 212 to 216 may have a first half end portion disposed on a corresponding chip and a second half end portion disposed on a corresponding spacer in some embodiments of the present invention. For example, the second chip 212 may include two half end portions 2121 and 2122 with respect to a bisector 2123 on the long side of the second chip 212. The first half end portion 2121 of the second chip 212 is disposed on the first chip 210, and the second half end portion 2122 of the second chip 212 is disposed on the first spacer 250. Similarly, the third chip 214 has a first half end portion 2141 disposed on the second half end portion 2122 of the second chip 212, and a second half end portion 2142 disposed on the second spacer 252. The fourth chip 216 has a first half end portion 2161 disposed on the second half end portion 2142 of the third chip 214, and a second half end portion 2162 disposed on the third spacer 254.

In this case, the three spacers 250, 252, and 254 are able to support the chips 212 to 216 stacked above the first chip 210 steadily. However, in some embodiments, more spacers can still be applied in the semiconductor device 200 according to the system requirements. In some embodiments, to further concrete the structure of the semiconductor device 200, adhesion layers can be applied below the chips 210 to 216 and the spacers 250, 252, and 254. Therefore, the chips 210 to 216 and the spacers 250, 252, and 254 can be disposed stably in a fixed position.

In addition, in some embodiments, the semiconductor device 200 may further include more chips. With the same stacking structure shown in FIG. 2, the semiconductor device 200 may further stack more chips on the four chips 210 to 214 without increasing the area projected onto the substrate 230 while the semiconductor device 200 still have a reduced number of spacers when compared to the prior art.

Figure 3:
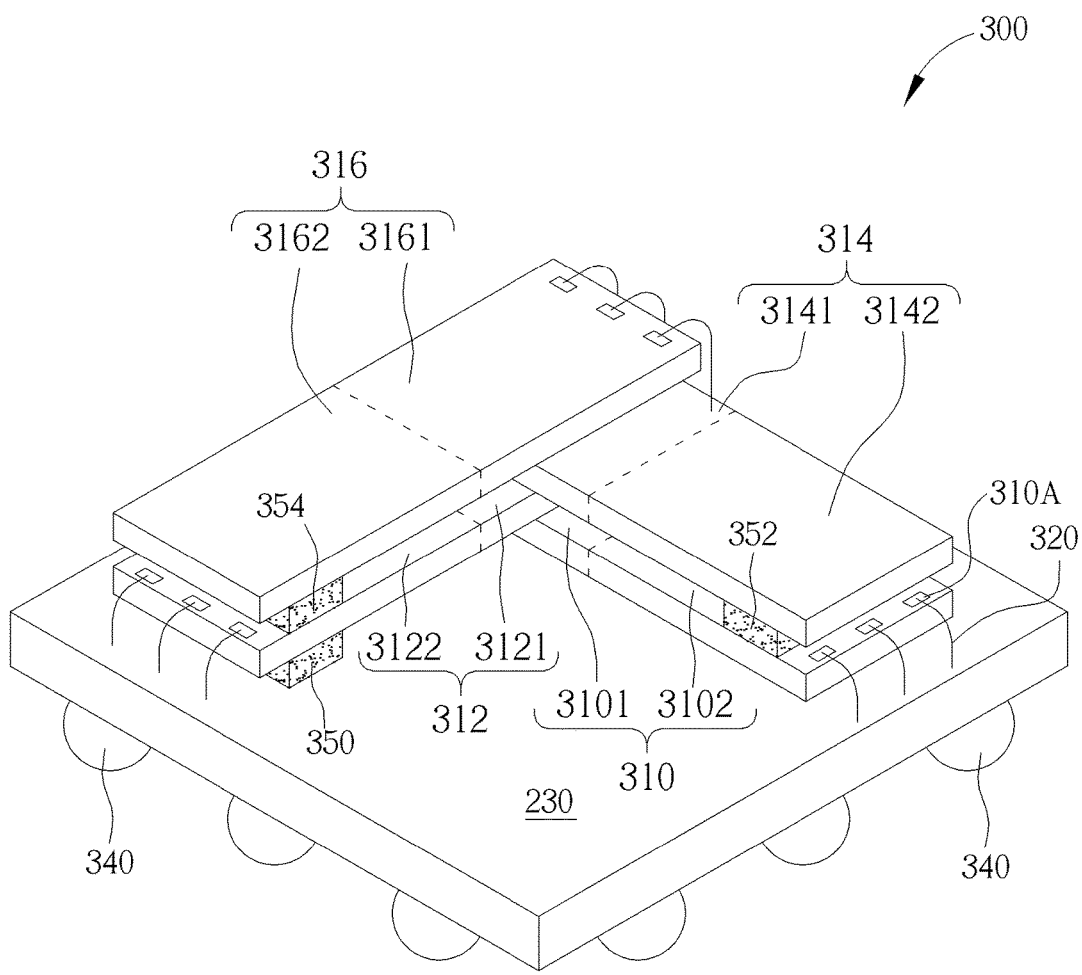
FIG. 3 shows a semiconductor device according to another embodiment of the present invention.

FIG. 3 shows a semiconductor device 300 according to another embodiment of the present invention. The semiconductor device 300 includes four chips 310, 312, 314 and 316, and three spacers 350, 352, and 354. The four chips 310 to 316 are stacked on the first surface of the substrate 330 and a plurality of soldering bumps 340 are planted on the second surface of the substrate 330.

The first spacer 350 is disposed on the first surface of the substrate 330. The second chip 312 has a first half end portion 3121 disposed on a first half end portion 3101 of the first chip 310, and a second half end portion 3122 disposed on the first spacer 350. To ensure the second chip 312 can be disposed on the first spacer 350 and the first chip 310 steadily. The height of the first spacer 350 should be substantially equal to the height of the first chip 310 after being disposed on the substrate 230.

The second spacer 352 is disposed on a second half end portion 3102 of the first chip 310. The third chip 314 has a first half end portion 3141 disposed on the first half end portion 3121 of the second chip 312, and a second half end portion 3142 disposed on the second spacer 352. To ensure the third chip 314 may be disposed on the second spacer 352 and the second chip 312 steadily, the height of the second spacer 352 should be substantially equal to the height of the second chip 312.

The third spacer 354 is disposed on the second half end portion 3122 of the second chip 312. The fourth chip 316 has a first half end portion 3161 disposed on the first half end portion 3141 of the third chip 314, and a second half end portion 3162 disposed on the third spacer 354. To ensure the fourth chip 316 may be disposed on the third spacer 354 and the third chip 314 steadily. The height of the third spacer 354 from the substrate 330 may be substantially equal to the height of the third chip 314.

In this embodiment, the thickness of the spacers 350, 352, and 354 may be substantially equal to each other.

Also, in FIG. 3, since the bonding pads 310A of the first chip 310 are located along an edge of the second half end portion 3102 of the first chip 310, the second spacer 352 and the third chip 314 can be stacked above the second half end portion 3102 of the first chip 310 without covering the bonding pad 310A of the first chip 310. Therefore, the bonding pad 310A can be connected to the substrate 330 through the bonding wires 320 without obstacle during the bonding process. The same rule also applies when disposing the third chip 314, the fourth chip 316, and the third spacer 354. Furthermore, by proper arrangement, the bonding pads of the four chips 310 to 316 can be disposed at different directions so that the bonding process can be simplified.

To further concrete the structure of the semiconductor device 300, adhesion layers can be applied below the chips 310 to 316 and the spacers 350, 352, and 354 in some embodiments. Therefore, the chips 310 to 316 and the spacers 350, 352, and 354 may be disposed stably in a fixed position.

By stacking the chip on one half end portion of another chip and one spacer, the semiconductor device 300 needs only three spacers 350, 352, and 354 to support the chips 312 to 316. Therefore, comparing to the six spacers required by the prior art as shown in FIG. 1, the manufacturing process of the semiconductor device 300 is simplified, thereby improving the yield of the manufacturing process.

Figure 4:
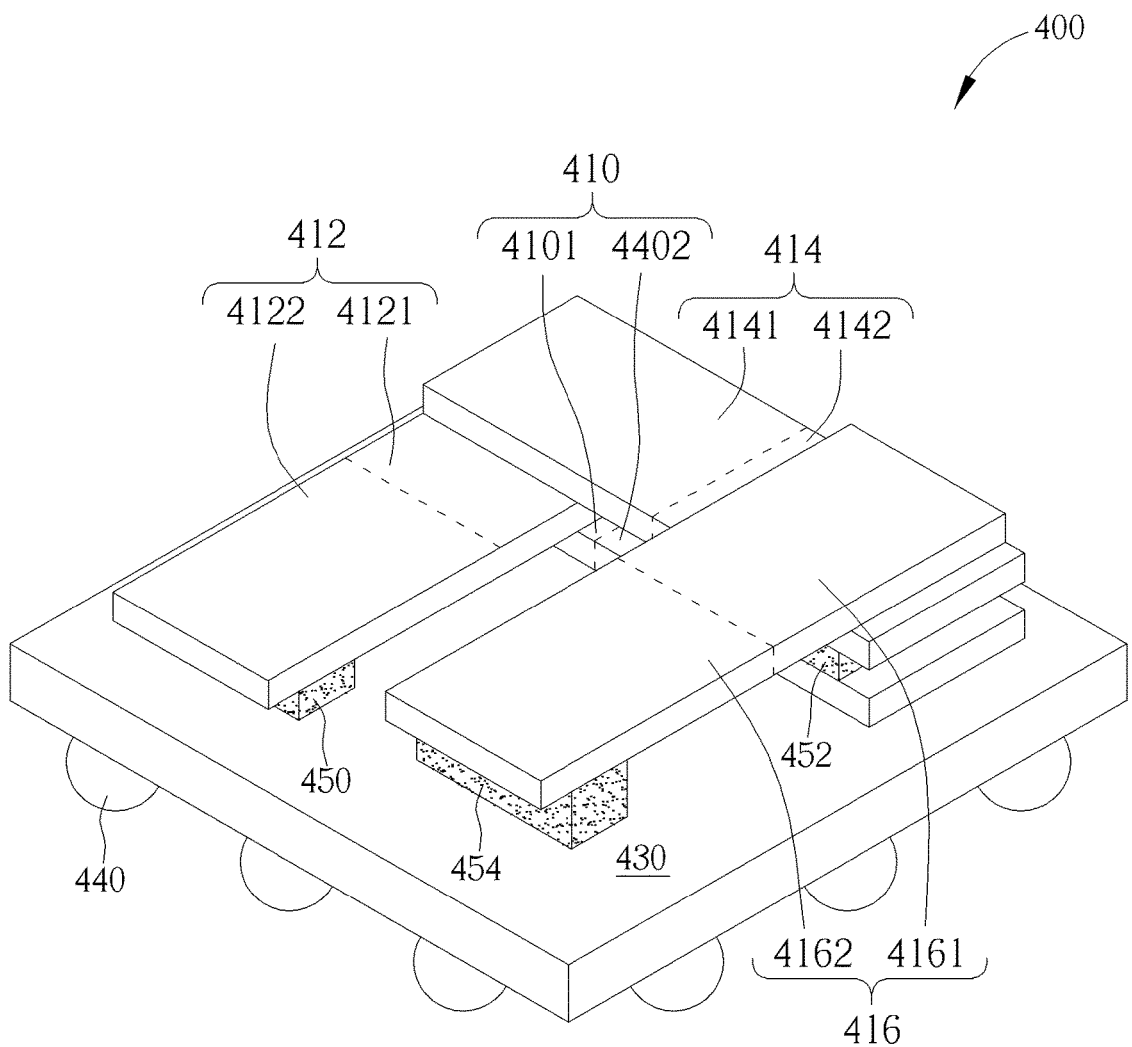
FIG. 4 shows a semiconductor device according to another embodiment of the present invention.

FIG. 4 shows a semiconductor device 400 according to another embodiment of the present invention. The semiconductor device 400 includes four chips 410, 412, 414 and 416, and three spacers 450, 452, and 454. The four chips 410 to 416 are stacked on the first surface of the substrate 430 and a plurality of soldering bumps 440 are planted on the second surface of the substrate 430.

The first chip 410, the first spacer 450 and the third spacer 454 are disposed on a substrate 430. The second chip 412 has a first half end portion 4121 disposed on a first half end portion 4101 of the first chip 410, and a second half end portion 4122 disposed on the first spacer 450. To ensure the second chip 412 can be disposed on the first spacer 450 and the first chip 410 steadily, the height of the first spacer 450 should be substantially equal to the height of the first chip 410.

The second spacer 452 is disposed on a second half end portion 4102 of the first chip 410. The third chip 414 has a first half end portion 4141 disposed on the first half end portion 4121 of the second chip 412, and a second half end portion 4142 disposed on the second spacer 452. The height from the substrate 430 of the second spacer 452 is substantially equal to the height of the second chip 412. The fourth chip 416 has a first half end portion 4161 disposed on the second half end portion 4142 of the third chip 414, and a second half end portion 4162 disposed on the third spacer 454. The height of the third spacer 454 is substantially equal to the total height of the first chip 410, the second chip 412, and the third chip 414.

To further concrete the structure of the semiconductor device 400, adhesion layers can be applied below the chips 410 to 416 and the spacers 450, 452, and 454 in some embodiments. Therefore, the chips 410 to 416 and the spacers 450, 452, and 454 can be disposed stably in a fixed position.

By stacking the chip on one half end portion of another chip and one spacer, the semiconductor device 400 needs only three spacers 450, 452, and 454 to support the four chips 410 to 416. Therefore, comparing to the six spacers required by the prior art as shown in FIG. 1, the manufacturing process of the semiconductor device 400 is simplified, improving the yield of the manufacturing process.

Figure 5:
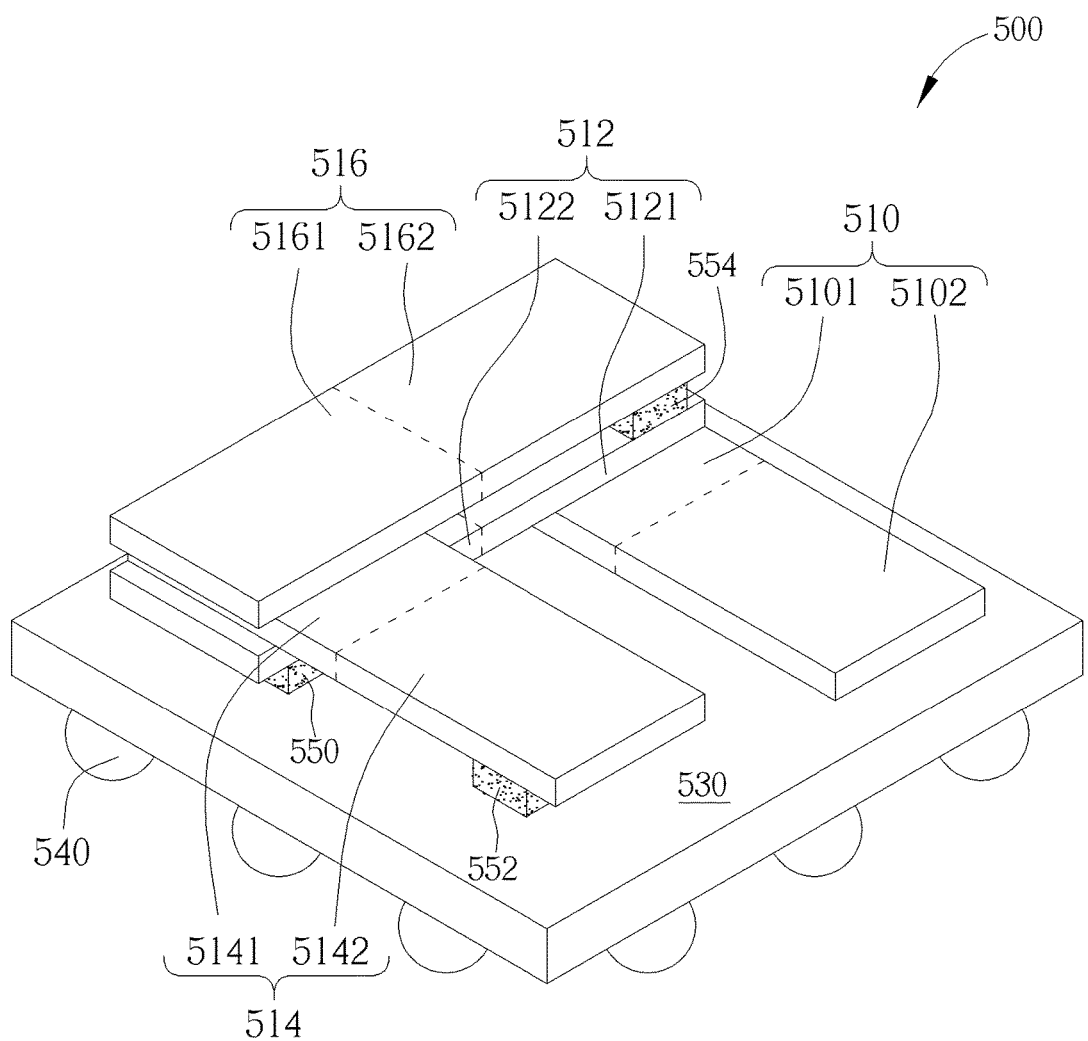
FIG. 5 shows a semiconductor device according to another embodiment of the present invention.

FIG. 5 shows a semiconductor device 500 according to another embodiment of the present invention. The semiconductor device 500 includes four chips 510, 512, 514 and 516, and three spacers 550, 552, and 554. The four chips 510 to 516 are stacked on the first surface of the substrate 530 and a plurality of soldering bumps 540 are planted on the second surface of the substrate 530

The first chip 510, the first spacer 550 and the second spacer 552 are disposed on a substrate 530. The second chip 512 has a first half end portion 5121 disposed on a first half end portion 5101 of the first chip 510, and a second half end portion 5122 disposed on the first spacer 550. To ensure the second chip 512 can be disposed on the first spacer 550 and the first chip 510 steadily, the height of the first spacer 550 should be substantially equal to the height of the first chip 510.

The third chip 514 has a first half end portion 5141 disposed on the second half end portion 5122 of the second chip 512, and a second half end portion 5142 disposed on the second spacer 552. The height of the second spacer 552 is substantially equal to the total height of the first chip 510 and the second chip 512. The third spacer 554 is disposed on the first half end portion 5121 of the second chip 512. The fourth chip 516 has a first half end portion 5161 disposed on the first half end portion 5141 of the third chip 514, and a second half end portion 5162 disposed on the third space 554. The height of the third spacer 554 is substantially equal to the height of the third chip 514.

To further concrete the structure of the semiconductor device 500, adhesion layers can be applied below the chips 510 to 516 and the spacers 550, 552, and 554 in some embodiments. Therefore, the chips 510 to 516 and the spacers 550, 552, and 554 can be disposed stably in a fixed position.

By stacking the chip on one half end portion of another chip and one spacer, the semiconductor device 500 needs only three spacers 550, 552, and 554 to support the four chips 510 to 516. Therefore, comparing to the six spacers required by the prior art as shown in FIG. 1, the manufacturing process of the semiconductor device 500 is simplified, improving the yield of the manufacturing process.

Figure 6:
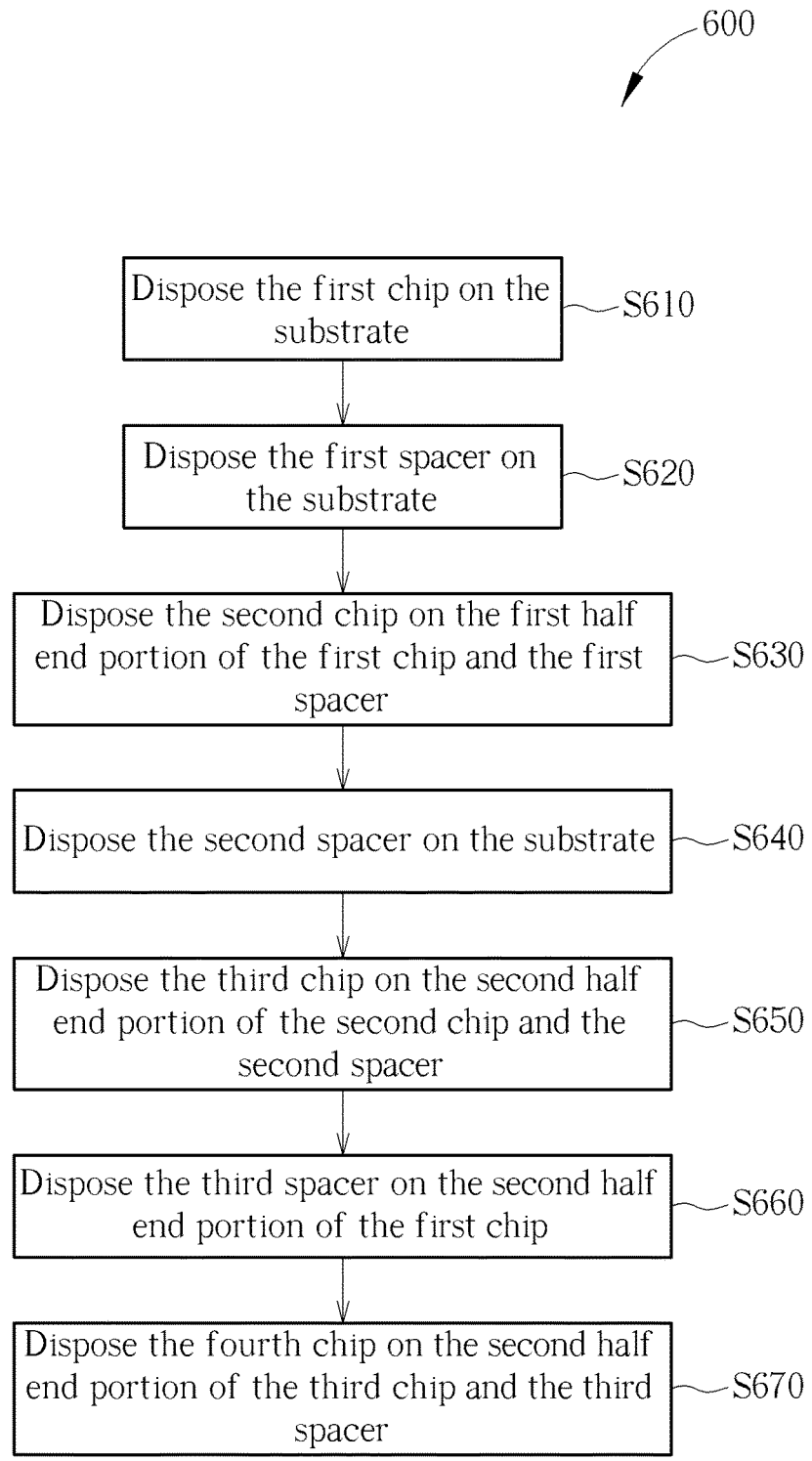
FIG. 6 shows a flow chart of a method for producing the semiconductor device in FIG. 2.

FIG. 6 shows a flow chart of a method 600 for producing the semiconductor device 200. The method 600 includes steps S610 to S670 but is not limited to the following sequence, for instance, Steps S640 can be performed before S610 to S630.

S610: dispose the first chip 210 on the substrate 230;
S620: dispose the first spacer 250 on the substrate 230;
S630: dispose the second chip 212 on the first half end portion 2101 of the first chip 210 and the first spacer 250;
S640: dispose the second spacer 252 on the substrate 230;
S650: dispose the third chip 214 on the second half end portion 2122 of the second chip 212 and the second spacer 252;
S660: dispose the third spacer 254 on the second half end portion 2102 of the first chip 210;
S670: dispose the fourth chip 216 on the second half end portion 2142 of the third chip 214 and the third spacer 254.

In addition, in some embodiment, the method 600 may further include steps to apply adhesion layers below the chips 210 to 216 and the spacers 250 to 254 before stacking the chips 210 to 216 and the spacers 250 to 254.

Figure 7:
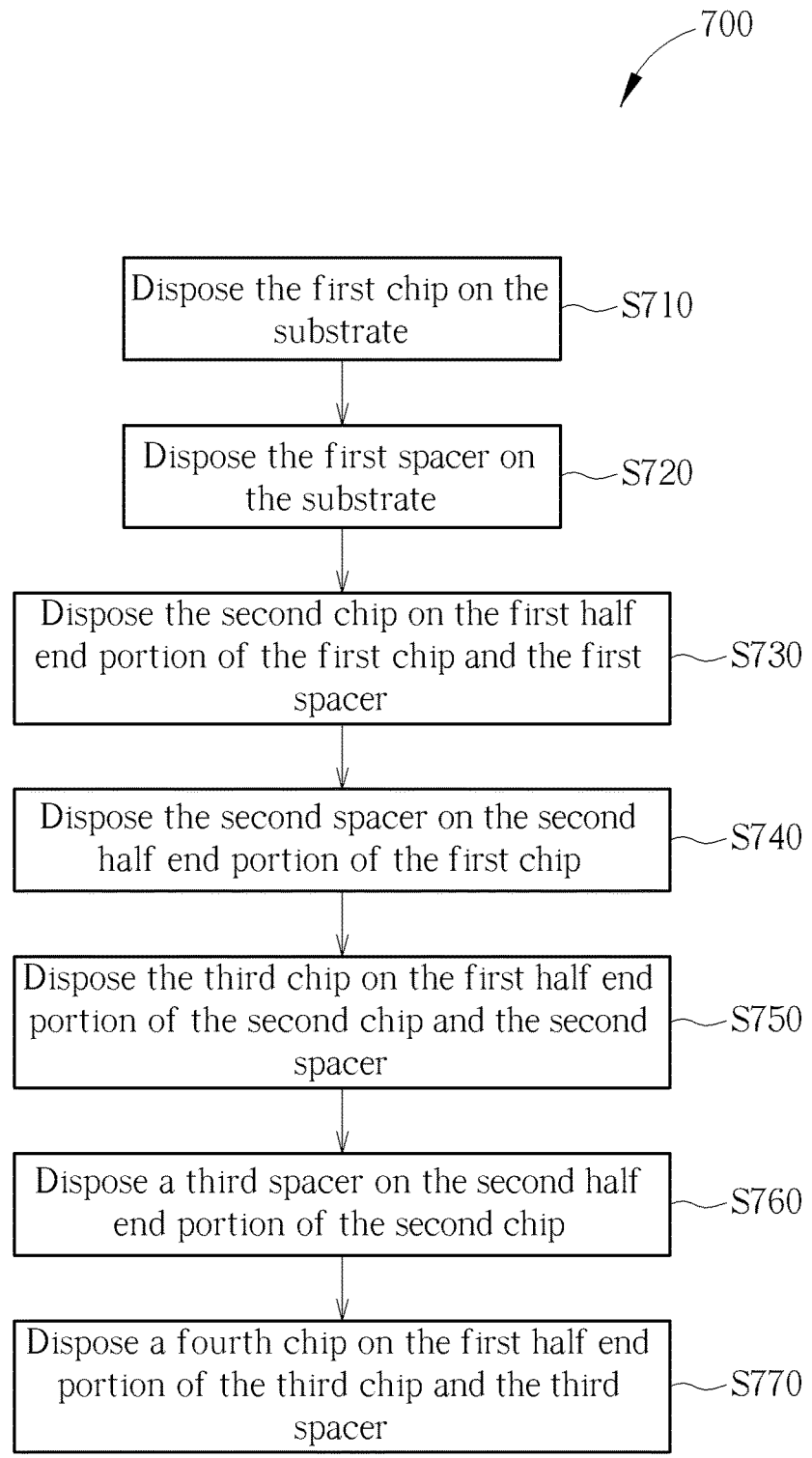
FIG. 7 shows a flow chart of a method for producing the semiconductor device in FIG. 3.

FIG. 7 shows a flow chart of a method 700 for producing the semiconductor device 300. The method 700 includes Steps S710 to S770 but is not limited to the following sequence, for instance, Steps S710 and S720 can be switched, Steps S730 and S740 can be switched, and Steps S750 and S760 can be switched.

S710: dispose the first chip 310 on the substrate 330;
S720: dispose the first spacer 350 on the substrate 330;
S730: dispose the second chip 312 on the first half end portion 3101 of the first chip 310 and the first spacer 350;
S740: dispose the second spacer 352 on the second half end portion 3102 of the first chip 310;
S750: dispose the third chip 314 on the first half end portion 3121 of the second chip 312 and the second spacer 352;

S760: dispose a third spacer 354 on the second half end portion 3122 of the second chip 312;
S770: dispose a fourth chip 316 on the first half end portion 3141 of the third chip 314 and the third spacer 354.

In addition, in some embodiment, the method 700 may further include steps to apply adhesion layers below the chips 710 to 716 and the spacers 750 to 754 before stacking the chips 710 to 716 and the spacers 750 to 754.

Figure 8:
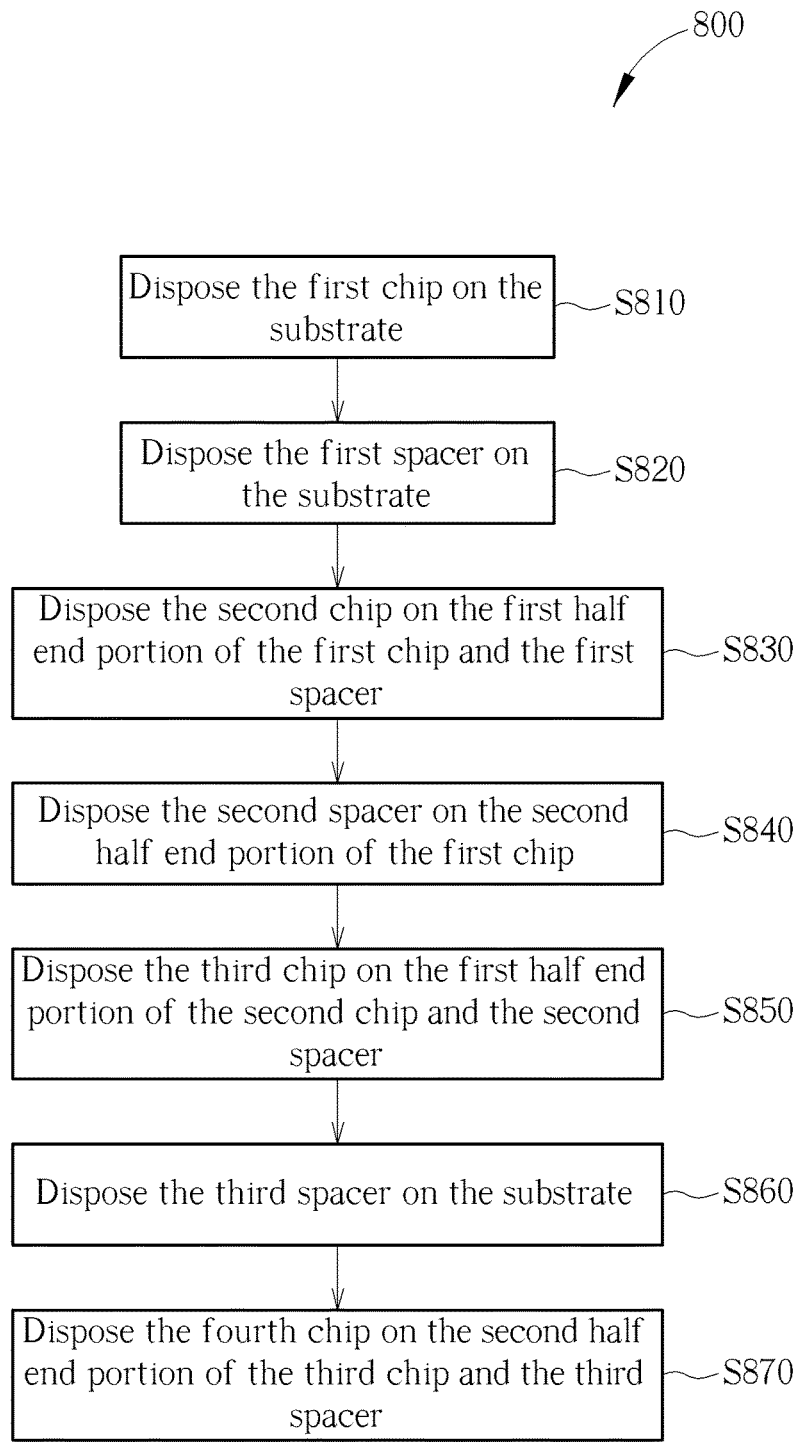
FIG. 8 shows a flow chart of a method for producing the semiconductor device in FIG. 4.

FIG. 8 shows a flow chart of a method 800 for producing the semiconductor device 400. The method 800 includes steps S810 to S870 but is not limited to the following sequence, for instance, Steps S860 can be performed before S810 to S850.
S810: dispose the first chip 410 on the substrate 430;
S820: dispose the first spacer 450 on the substrate 430;
S830: dispose the second chip 412 on the first half end portion 4101 of the first chip 410 and the first spacer 450;
S840: dispose the second spacer 452 on the second half end portion 4102 of the first chip 410;
S850: dispose the third chip 414 on the first half end portion 4121 of the second chip 412 and the second spacer 452;
S860: dispose the third spacer 454 on the substrate 430;
S870: dispose the fourth chip 416 on the second half end portion 4142 of the third chip 414 and the third spacer 454.

In addition, in some embodiment, the method 800 may further include steps to apply adhesion layers below the chips 810 to 816 and the spacers 850 to 854 before stacking the chips 810 to 816 and the spacers 850 to 854.

Figure 9:
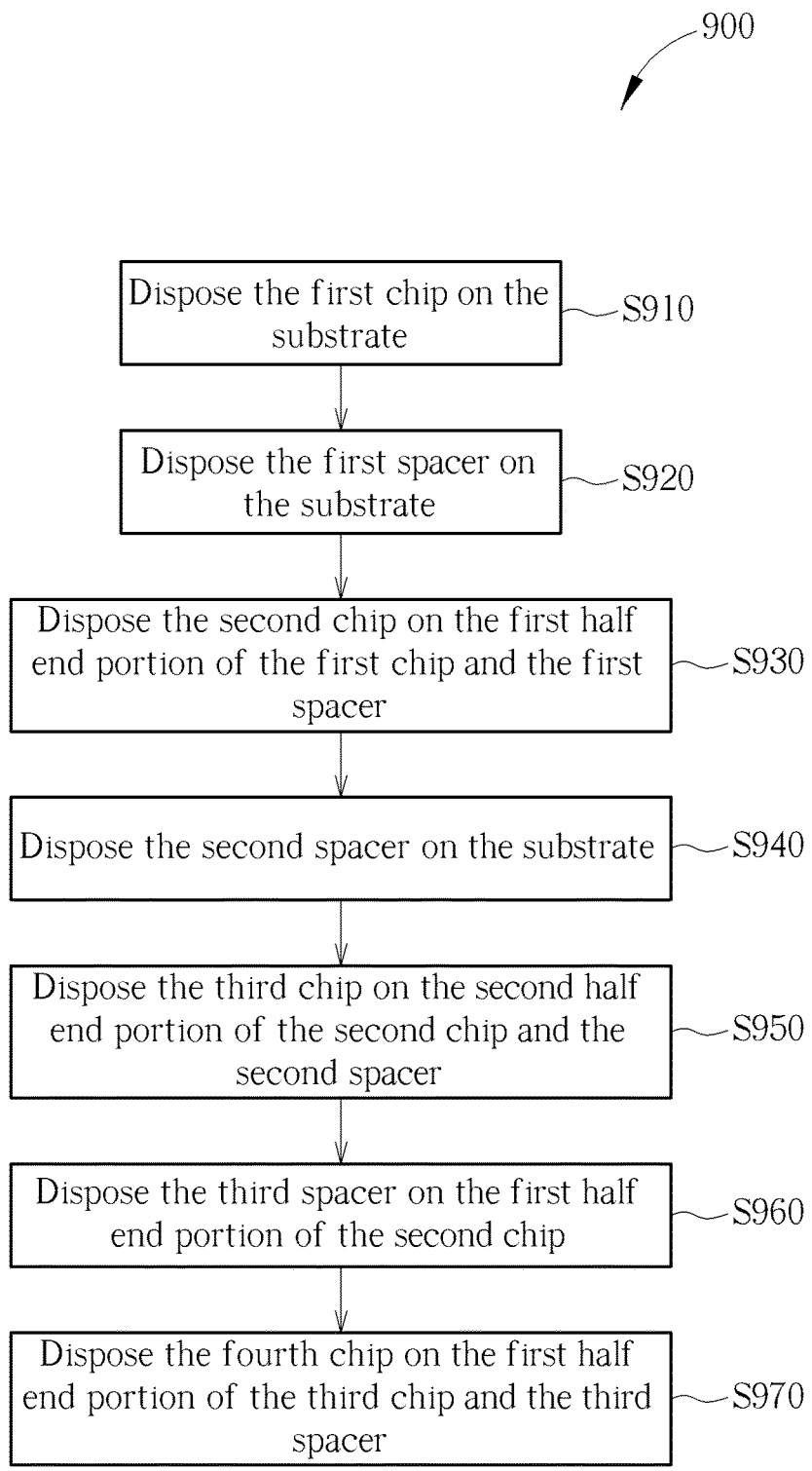
FIG. 9 shows a flow chart of a method for producing the semiconductor device in FIG. 5.

FIG. 9 shows a flow chart of a method 900 for producing the semiconductor device 500. The method 900 includes steps S910 to S970 but is not limited to the following sequence, for instance, Steps S940 can be performed before S910 to S930.
S910: dispose the first chip 510 on the substrate 530;
S920: dispose the first spacer 550 on the substrate 530;
S930: dispose the second chip 512 on the first half end portion 5101 of the first chip 510 and the first spacer 550;
S940: dispose the second spacer 552 on the substrate 530;
S950: dispose the third chip 514 on the second half end portion 5122 of the second chip 512 and the second spacer 552;
S960: dispose the third spacer 554 on the first half end portion 5121 of the second chip 512;
S970: dispose the fourth chip 516 on the first half end portion 5141 of the third chip 514 and the third spacer 554.

In addition, in some embodiment, the method 900 may further include steps to apply adhesion layers below the chips 910 to 916 and the spacers 950 to 954 before stacking the chips 910 to 916 and the spacers 950 to 954.

In summary, according to the semiconductor device and the method for producing the semiconductors provided by the embodiments of the present invention, the number of spacers required by the semiconductor device can be reduced by stacking the chip on one half end portion of another chip and one spacer, instead of in the middle of another chip. Consequently, the manufacturing process of the semiconductor device can be simplified and the yield of the manufacturing process can be improved. In addition, with the same stacking structures shown in the embodiments of the present invention, the semiconductor device may further stack more chips without increasing the area projected onto the substrate while reducing the number of spacers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device comprising:
a substrate;
a plurality of chips stacked on a first surface of the substrate, wherein odd chips of the plurality of chips are staggered stacked from each other, and even chips of the plurality of chips are staggered from each other;
a plurality of spacers for supporting the plurality of chips;
a plurality of soldering bumps planted on a second surface of the substrate;
wherein:
the odd chips and the even chips are stacked in an interleaving manner from each other and an orientation of each odd chip is perpendicular to an orientation of each even chip;
a first chip of the plurality of chip is disposed on the substrate;
each of the plurality of chips above the first chip is supported by at least one spacer;
a first spacer is disposed on the first surface of the substrate, and the first spacer has a height substantially equal to a height of the first chip;
a second chip of the plurality of chips is stacked on the first spacer and the first chip;
a second spacer is disposed on the first surface of the substrate, and the second spacer has a height substantially equal to a total height of the first chip and the second chip; and
a third chip of the plurality of chips is stacked on the second spacer and the second chip.
2. The semiconductor device of claim 1 wherein:
the second chip of the plurality of chips has a first half end portion disposed on a first half end portion of the first chip, and a second half end portion disposed on the first spacer;
the third chip of the plurality of chips has a first half end portion disposed on the first half end portion of the second chip, and a second half end portion disposed on the second spacer;
a third spacer of the plurality of spacers is disposed on the first half end portion of the second chip and has a height substantially equal to a height of the third chip; and
a fourth chip of the plurality of chips has a first half end portion disposed on the first half end portion of the third chip, and a second half end portion disposed on the third spacer.
3. The semiconductor device of claim 1, wherein the first chip and the plurality of chips are rectangular chips.
4. The semiconductor device of claim 1, wherein the first chip and the plurality of chips have a same shape and a same size.
5. A method for producing a semiconductor device comprising:
disposing a first chip on a substrate, wherein the first chip has a first half end portion and a second half end portion;
disposing a first spacer on a first surface of the substrate;
disposing a second chip on the first chip and the first spacer, wherein the second chip has a first half end portion disposed on the first half end portion of the first chip, and a second half end portion disposed on the first spacer;
disposing a second spacer on the second half end portion of the first chip;

disposing a third chip on the second chip and the second spacer, wherein the third chip has a first half end portion disposed on the first half end portion of the second chip, and a second half end portion on the second spacer;

disposing a third spacer on the substrate; and disposing a fourth chip on the third chip and the third spacer, wherein the fourth chip has a first half end portion disposed on the second half end portion of the third chip, and a second half end portion disposed on the third spacer;

wherein:

a height of the first spacer is substantially equal to a height of the first chip;

a height of the second spacer is substantially equal to a height of the second chip; and a height of the third spacer is substantially equal to a total height of the first chip, the second chip, and the third chip.

6. The method of claim 5, wherein the first chip and the second chip have a same shape and a same size.

7. The method of claim 5, wherein the first chip, the second chip, and the third chip have a same shape and a same size.

8. A method for producing a semiconductor device comprising:

disposing a first chip on a substrate, wherein the first chip has a first half end portion and a second half end portion;

disposing a first spacer on a first surface of the substrate;

disposing a second chip on the first chip and the first spacer, wherein the second chip has a first half end portion disposed on the first half end portion of the first chip, and a second half end portion disposed on the first spacer;

disposing a second spacer on the substrate; and disposing a third chip on the second chip and the second spacer, wherein the third chip has a first half end portion disposed on the second half end portion of the second chip, and a second half end portion disposed on the second spacer;

wherein:

a height of the first spacer is substantially equal to a height of the first chip; and a height of the second spacer is substantially equal to a total height of the first chip and the second chip.

9. The method of claim 8, wherein the first chip, the second chip, and the third chip have a same shape and a same size.

10. The method of claim 8, further comprising:

disposing a third spacer on the first half end portion of the second chip; and disposing a fourth chip on the third chip and the third spacer, wherein the fourth chip has a first half end portion disposed on the first half end portion of the third chip, and a second half end portion disposed on the third spacer;

wherein:

a height of the third spacer is substantially equal to a height of the third chip.

11. The method of claim 8, further comprising:

disposing a third spacer on the second half end portion of the first chip; and disposing a fourth chip on the third chip and the third spacer, wherein the fourth chip has a first half end portion disposed on the second half end portion of the third chip, and a second half end portion disposed on the third spacer;

wherein:

a height of the third spacer is substantially equal to a total height of the second chip and the third chip.

* * * * *